United States Patent [19]
Shin

[11] Patent Number: 5,807,768
[45] Date of Patent: Sep. 15, 1998

[54] METHOD FOR FABRICATING A HEAT SINK-INTEGRATED SEMICONDUCTOR PACKAGE

[75] Inventor: Won Sun Shin, Seoul, Rep. of Korea

[73] Assignees: Anam Industrial Co., Ltd., Seoul, Rep. of Korea; Amkor Electronics, Inc., Chandler, Ariz.

[21] Appl. No.: 707,381

[22] Filed: Sep. 4, 1996

[30] Foreign Application Priority Data

Sep. 4, 1995 [KR] Rep. of Korea ..................... 95-28771

[51] Int. Cl.⁶ .................................................. H01L 21/56
[52] U.S. Cl. ......................... 438/127; 438/122; 438/124
[58] Field of Search .................................. 438/121, 122, 438/124, 127

[56] References Cited

U.S. PATENT DOCUMENTS

| 4,026,008 | 5/1977 | Drees et al. | 438/15 |
| 4,048,356 | 9/1977 | Bakos et al. | 427/379 |
| 4,769,344 | 9/1988 | Sakai et al. | 438/124 |
| 5,173,766 | 12/1992 | Long et al. | 257/687 |
| 5,206,794 | 4/1993 | Long | 438/123 |
| 5,406,117 | 4/1995 | Dlugokecki et al. | 257/659 |
| 5,434,105 | 7/1995 | Liou | 438/122 |

FOREIGN PATENT DOCUMENTS

| 6-298900 | 10/1994 | Japan . |
| 7-145230 | 6/1995 | Japan . |

Primary Examiner—John Niebling
Assistant Examiner—Kevin F. Turner
Attorney, Agent, or Firm—Skjerven Morrill MacPherson Franklin & Friel LLP

[57] ABSTRACT

A heat sink-integrated semiconductor package is fabricated by a characteristic method comprising the steps of dispensing a liquid epoxy resin over at least the bare surface of a heat sink mounted with a semiconductor chip, curing said dispensed liquid epoxy resin to form a first encapsulating part so as to prevent delamination at the interface between said heat sink and said semiconductor chip, molding a mold compound to form a second encapsulating part to protect said package from the external environment. The semiconductor package of the present invention, the first encapsulating part is of stronger bonding strength than the second encapsulating part, so that the delamination phenomenon at the interface between heat sink and semiconductor chip can be prevented or relieved efficiently.

9 Claims, 6 Drawing Sheets

FIG. 3B
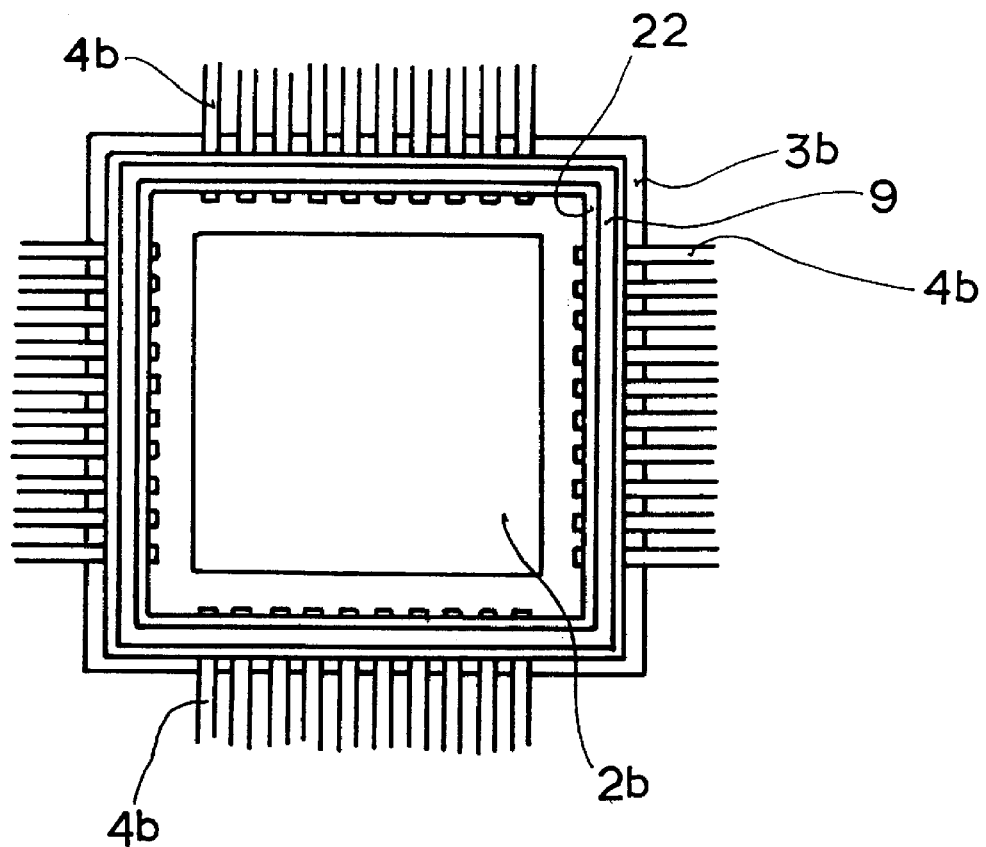
PRIOR ART  FIG. 6
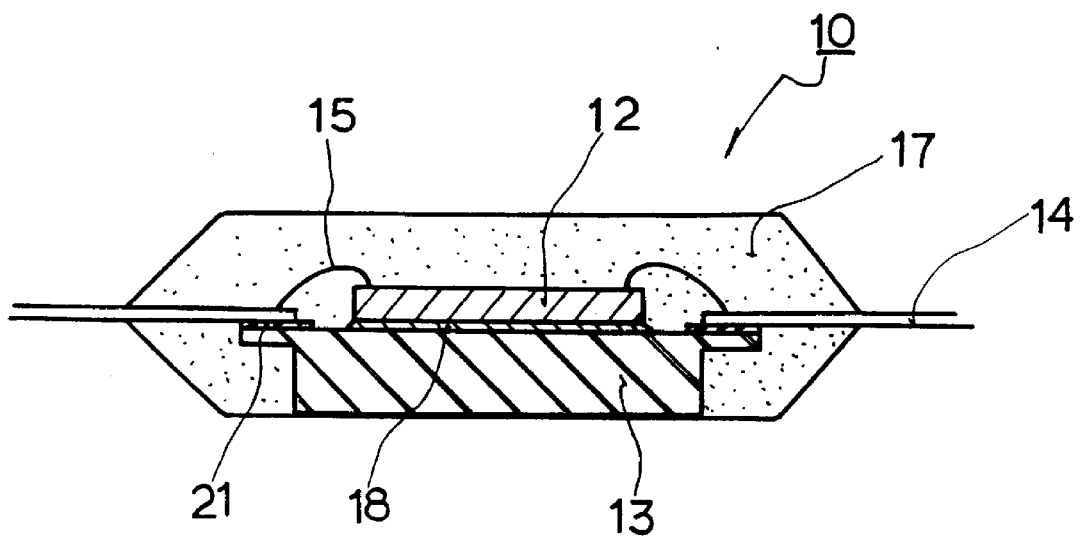

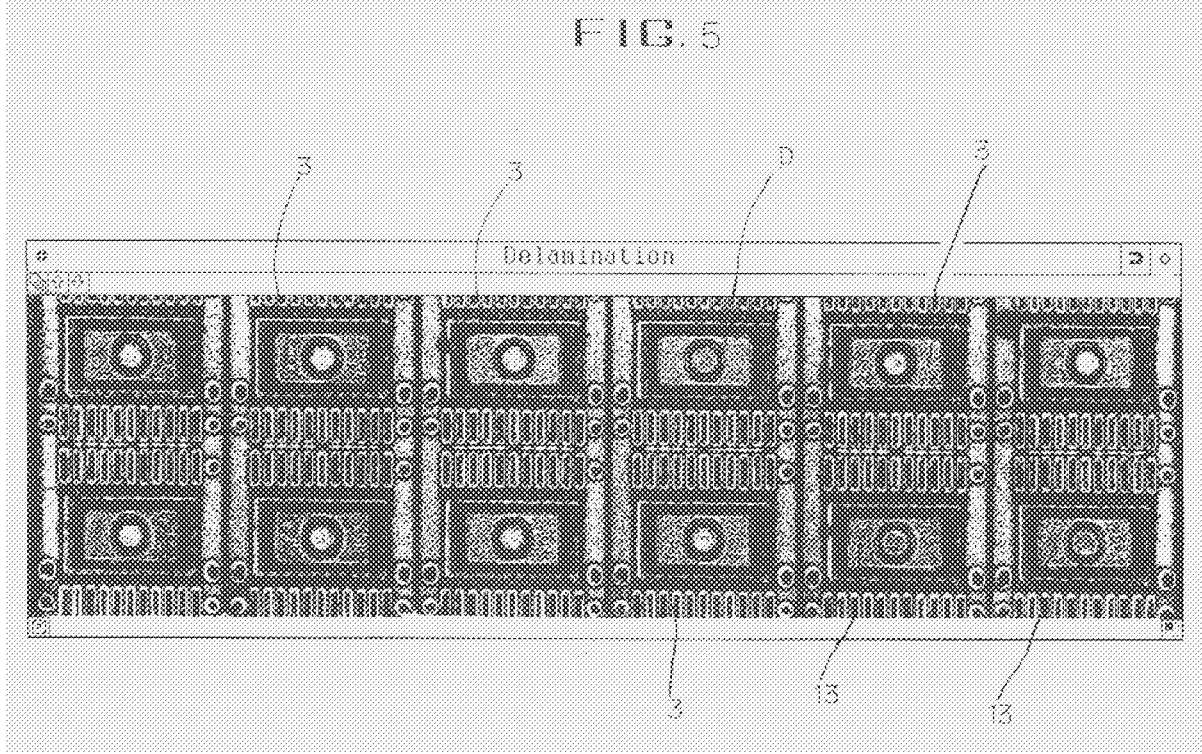

METHOD FOR FABRICATING A HEAT SINK-INTEGRATED SEMICONDUCTOR PACKAGE

BACKGROUND OF THE INVENTION

1. Field of the Invention

The present invention relates to a heat sink-integrated semiconductor package with double encapsulating parts and a method for fabricating the same. More particularly, the present invention is concerned with a heat sink-integrated semiconductor package preventing delamination at the interface of the heat sink and the package.

2. Description of the Prior Art

A typical heat sink-integrated semiconductor package with a single encapsulating part, as illustrated in FIG. 6, comprises a heat sink 13, a plurality of leads 14 attached to the heat sink 13 along the peripheral surface of the heat sink by an adhesive tape 21, with a regular distance therebetween, a semiconductor chip 12 mounted by die adhesion epoxy 18 on the central part of the surface of the heat sink 13, a wire 15 for electrically connecting the leads with a chip pad (not shown) of the semiconductor chip 12, and a single mold compound encapsulating part 17 for protecting the leads 14 and the semiconductor chip 12 from external environment.

A method for fabricating such heat sink-integrated semiconductor package generally comprises a leads attaching step, a step of mounting a semiconductor chip, a step of wire bonding, and a step of molding a single mold compound encapsulating part, i.e. an encapsulant, thereabout. In the attaching step, an adhesive tape 21 is used to bind a plurality of leads 14 to the heat sink 13 along the peripheral surface of the heat sink 13 with a regular distance therebetween. In the mounting step, the semiconductor chip 12 is mounted on the center of the surface of the heat sink 13 by means of an adhesive epoxy layer 18. The bonding step is to electrically connect the leads 14 with chip pads (not shown) on the semiconductor chip 12 by wire 15. The single mold compound encapsulating part 17 is formed by molding a mold compound to protect the leads 14, the semiconductor chip 12 and the wire 15 from the external environment.

A significant problem of such a conventional heat sink-integrated semiconductor package with a single encapsulating part is that the interfaces between the single mold compound encapsulating part 17 and the heat sink 13 are likely to peel at the exposed locations because the stress attributable to a relatively large difference in the thermal expansion coefficients therebetween is focused on those locations. Once such interface delamination occurs, not only can moisture easily penetrate into the fine cavities thus generated but the efficiency of thermal conductivity from the semiconductor chip 12 through the heat sink 13 is lowered. Thus, the interface delamination is one of the worst factors which deleteriously affect the reliability of the semiconductor package.

An effort to prevent or relieve the interface delamination between the heat sink 13 and the semiconductor chip 12 was made in the step of molding a mold compound into the single mold compound encapsulating part 17. An adhesion promoter was added at an amount of 3% by weight based on the total amount of the mold compound, with the aim of enhancing the bonding strength of the mold compound. However, this resulted in aggravating the sticking of mold compound to the mold, making the molding inefficient or impossible. Thus, the adhesion promoter cannot help if added at an amount of less than 3% by weight based on the total weight of the mold compound, in the conventional method, producing unreliable semiconductor packages the interfaces of which are ready to peel away.

SUMMARY OF THE INVENTION

Therefore, it is an object of the present invention to overcome the above problems encountered in prior arts and to provide a highly reliable heat sink-integrated semiconductor package.

It is another object of the present invention to provide a heat sink-integrated semiconductor package in which a delamination phenomenon by little or no means occurs at the interface between a heat sink and a semiconductor chip.

It is a further object of the present invention to provide a method for fabricating the heat sink-integrated semiconductor package.

In accordance with a first aspect of the present invention, there is provided a heat sink-integrated semiconductor package comprising a first encapsulating part made of a liquid epoxy resin added with an adhesion promoter, said first encapsulating part encapsulating at least the bare surface of a heat sink mounted with a semiconductor chip so as to prevent delamination at a contact interface between the heat sink and the semiconductor chip; and a second encapsulating part molded from a mold compound, said encapsulating part protecting said package from the external environment.

In accordance with a second aspect of the present invention, there is provided a method for fabricating a heat sink-integrated semiconductor package with double encapsulating parts, comprising the steps of dispensing a liquid epoxy resin over at least the bare surface of a heat sink mounted with a semiconductor chip, curing said dispensed liquid epoxy resin to form a first encapsulating part so as to prevent delamination at the interface between said heat sink and said semiconductor chip, molding a mold compound to form a second encapsulating part to protect said package from external environment.

In the semiconductor package of the present invention, the first encapsulating part is of stronger bonding strength than the second encapsulating part, so that the delamination phenomenon at the interface between heat sink and semiconductor chip can be prevented or relieved efficiently.

Unlike the conventional one, the method according to the present invention does not show sticking to the mold, caused by the increased amount of adhesion promoter, because the formation of the first encapsulating part with the liquid epoxy resin having high bonding strength to metal is achieved by dispensing rather than molding.

It is favorable to use a liquid epoxy resin combined with elastomer since the resulting first encapsulating part has increased flexibility while being lower in modulus.

The term "liquid epoxy resin" as used herein stands for an epoxy resin which comprises the adhesion promoter, as defined below, at an amount of 3 to 25% by weight and no wax components and preferably elastomer, and shows a viscosity of 5–12 poise at 25° C., a glass transition point of 70° to 190° C., a thermal expansion coefficient of $0.5 \times 10^{-5}$–$7.5 \times 10^{-5}$/°C. after curing, and an electrical conductivity of not more than 70 $\mu$S/cm. The liquid epoxy resin may comprise typical agents including curing agents, low stress agents such as silicon dioxide, fillers, catalysts, and promoters.

The term "mold compound", as used herein, represents an electrically nonconductive epoxy resin which comprises the adhesion promoter, as defined below, at an amount of less than 3% by weight and shows a viscosity of up to 400 poise at 185° C. and a glass transition point of at least 150° C. The mold compound may comprise typical additives including elastomers, flame retardants, curing agents, low stress agents such as silicon dioxide, fillers, catalysts and promoters.

The term "adhesion promoter", as used herein, stands for a typically usable additive for reinforcing the bonding strength of the epoxy resin to a semiconductor chip or lead frame. Preferred are silane compounds such as

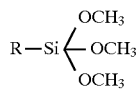

wherein R is ethylene oxide, amino acid, imino-mediated amino acid, thiol or ionomer group, or a high molecular weight compound having functional groups, such as amide, hydroxy, and carboxyl groups, serving as electron donors or electron acceptors linked to the main or side chain.

BRIEF DESCRIPTION OF THE DRAWINGS

Other objects and aspects of the invention will become apparent from the following description of embodiments with reference to the accompanying drawings in which:

FIG. 3B is a top view of the semiconductor package prior to the formation of the double encapsulating parts, according to the third embodiment of the present invention;

FIG. 5 is a scanning acoustic tomograph of the heat sink-integrated semiconductor package with double encapsulating parts according to the first embodiment of the present invention and of a conventional package, showing the delamination states after experiencing a severe condition;

FIG. 6 is a cross sectional view showing a conventional heat sink-integrated semiconductor package with a single encapsulating part;

DETAILED DESCRIPTION OF THE PREFERRED EMBODIMENTS

Figure 1:
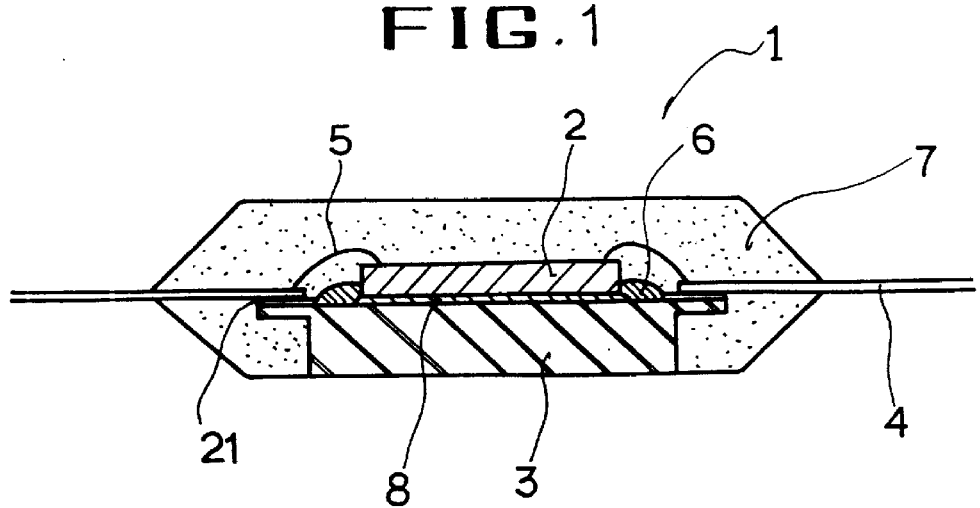
FIG. 1 is a cross sectional view showing a heat sink-integrated semiconductor package with double encapsulating parts, according to a first embodiment of the present invention.

The application of the preferred embodiments of the present invention is best understood with reference to the accompanying drawings, wherein like reference numerals are used for like and corresponding parts, respectively.

Figure 2:
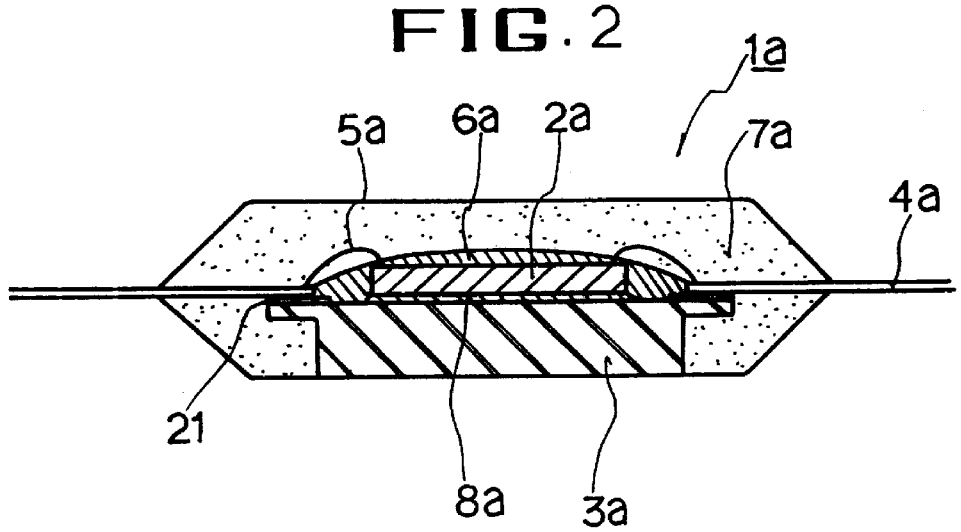
FIG. 2 is a cross sectional view showing a heat sink-integrated semiconductor package with double encapsulating parts, according to a second embodiment of the present invention.
Figure 3A:
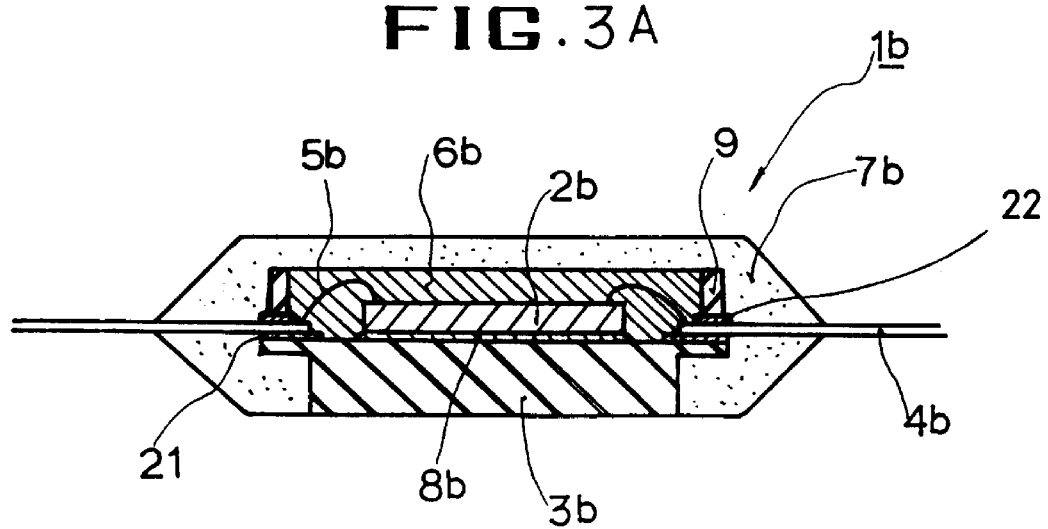
FIG. 3A is a cross sectional view showing a heat sink-integrated semiconductor package with double encapsulating parts, according to a third embodiment of the present invention.

FIGS. 1, 2 and 3A, each being cross sectional views of semiconductor package 1, 1a and 1b according to the preferred embodiments of the present invention, will be described at the same time for convenience because they have a similar basic structure.

As shown in these drawings, the heat sink-integrated semiconductor packages 1, 1a, 1b each comprise a heat sink 3, 3a, 3b, a plurality of leads 4, 4a, 4b attached to the heat sink 3, 3a, 3b along the peripheral surface of the heat sink by an adhesive tape 21, with a regular distance therebetween, a semiconductor chip mounted on the central part of the surface of the heat sink 3 by means of a die adhesive epoxy 8, 8a, 8b, a wire 5, 5a, 5b for electrically connecting the leads with chip pads (not shown) on the semiconductor chip 2, 2a, 2b, a first encapsulating part 6, 6a, 6b for covering at least the bare surface of the heat sink 3, 3a, 3b mounting the semiconductor chip 2, 2a, 2b upon its own surface, and a second encapsulating part 7, 7a, 7b surrounding the package so as to protect it from the external environment.

Although being similar in basic structure, the heat sink-integrated semiconductor packages 1, 1a and 1b with double encapsulating parts have their own characteristic properties, according to the present invention.

In the semiconductor package 1 shown in FIG. 1, the first encapsulating part 6 is formed on the bare surface of the heat sink 3, whose central and peripheral surfaces are covered with the semiconductor chip 2 and the adhesive tape 21, respectively.

As shown in FIG. 2, the semiconductor package 1a of the present invention comprises the first encapsulating part 6a, which is formed on the region defined by the inner ends of the leads 4a attached to the adhesive tape 21, covering not only the entire upper surface of the semiconductor chip 2a but also the bare upper surface of the heat sink 3a.

Differing from FIGS. 1 and 2 is the first encapsulating part 6b having a dam 9 shaped in rectangular ring and formed over the upper inner edges of the leads 4b attached on the peripheral part of the heat sink 3b by the adhesive 22 in the semiconductor package 1b shown in FIG. 3A. Within the region defined by the dam, the first encapsulating part 6b is formed, covering the entire upper surface of the semiconductor chip 2b, the bare upper surface of the heat sink 3b, and the connecting wires 5b.

FIG. 3B is a top view of the semiconductor package 1b of FIG. 3A, showing the region limited by the dam 9, prior to the formation of the double encapsulating parts. The dam 9 may be made of a metal superior in thermal conductivity, such as Cu. Al, Ni or the alloy thereof.

Although a metal is used as a material for the dam 9 in FIGS. 3A and 3B, the present invention is not limited to this. For example, the dam may be formed by dispensing a resin basically similar to the liquid epoxy resin and curing. In this case, it is unnecessary to use the adhesive 22.

A description will be given of the methods according to the present invention, in connection with the drawings. Therefore as in the structures of the semiconductor packages, the methods are similar to one another.

The heat sink-integrated semiconductor packages 1, 1a, 1b are basically fabricated by an attaching step of leads, a mounting step of a semiconductor chip using a die adhesion epoxy 8, 8a, 8b, a bonding step of wire, a dispensing step of liquid epoxy resin, a forming step of a first encapsulating part, and a molding step of a second encapsulating part. In the attaching step, a plurality of leads 4, 4a, 4b are attached to a heat sink 3, 3a, 3b along the peripheral part of its surface by an adhesive tape 21, with a regular distance therebetween. The mounting step is to mount a semiconductor chip 2, 2a, 2b on the central part of the surface of the heat sink 3, 3a, 3b to which the leads 4, 4a, 4b are attached. Then, the leads 4, 4a, 4b are electrically connected with a chip pad (not shown) by a wire 5, 5a, 5b. A liquid epoxy resin is dispensed over at least the bare surface of the heat sink 3, 3a, 3b which mounts the semiconductor chip 2, 2a, 2b thereupon. Thereafter, the liquid epoxy resin dispensed is cured to form a first encapsulating part 6, 6a, 6b which plays an important role in preventing or restraining the delamination phenomenon of the interface between the heat sink 3, 3a, 3b and the semiconductor chip 2, 2a, 2b. Finally, a mold compound is molded into a second encapsulating part 7, 7a, 7b to protect the leads 4, 4a, 4b, the semiconductor chip 2, 2a, 2b and the wire 5, 5a, 5b from the external environment.

In detail description, there is difference among individual methods for fabricating the heat sink-integrated semiconductor package 1, 1a, 1b with double encapsulating parts, according to the present invention.

In the semiconductor package 1 shown in FIG. 1, the dispensing step of liquid epoxy resin is achieved by dispensing the liquid epoxy resin over the bare surface of the heat sink 3 whose central and peripheral parts are covered with a semiconductor chip 2 and the adhesive tape 21 respectively. Thus, the dispensed liquid epoxy resin is formed in a rectangular ring if the lead frame is of the quad type.

For the semiconductor package 1a shown in FIG. 2, the liquid epoxy resin is dispensed over the region defined by the inner edges of the leads 4a formed on the adhesive tape 21, covering the bare surface of the heat sink 3a as well as the entire upper surface of the semiconductor chip 2a. Thus, the dispensed liquid epoxy resin is dome in shape.

In accordance with the third embodiment of the present invention, as shown in FIG. 3A, the dam shaped in a rectangular ring with a predetermined height is bonded on the inner edges of the leads 4b which are attached to the heat sink 3b along the peripheral part thereof and then, the liquid epoxy resin is dispensed within the region defined by the dam 9, covering the entire upper surface of the semiconductor chip 2a and the connecting wire 5b as well as the bare surface of the heat sink 3a. Thus, the shape of the dispensed liquid epoxy depends on the shape of the dam 9.

As shown in FIG. 3B, a top view, illustrating the region defined by the dam 9 prior to forming the double encapsulating parts, the dam forming step is carried out between the wire bonding step and the dispensing step. As described above, the dam 9 is made of not only a metal with excellent thermal conductivity, such as Cu, Al, Ni or the alloy thereof, but can formed by dispensing a resin similar to the liquid epoxy resin and curing it.

In accordance with the present invention, an adhesion promoter is preferably added in the liquid epoxy resin at an amount of 3 to 25% by weight and more preferably 3.5 to 10% by weight. For example, if the adhesion promoter is added at an amount less than 3% by weight then the resulting bonding strength is too low to prevent the interface delamination. On the other hand, if the amount of the adhesion promoter is over 25% by weight, the flow property of the resulting liquid epoxy resin is poor.

In addition, the typical and desirable examples of the elastomer in which the liquid epoxy resin is added are Acrylonitrile-butadiene-styrene (ABS) resin, nitrile resin, silicon resin or polyurethane resin. It is preferably added at an amount of 0.1 to 4% by weight. For example, if the elastomer is added at an amount less than 0.1% by weight then the addition effect will be insignificant. On the other hand, if too much elastomer is used, the resulting resin has a low physical strength or remains gelled after curing.

A better understanding of the present invention may be obtained through the following examples which are set forth to illustrate, but are not to be construed as the limit of the present invention.

TEST EXAMPLES I THROUGH V

The heat sink-integrated semiconductor package 1 with double encapsulating parts according to the first embodiment of the present invention (see FIG. 1) was put under a severe condition and the interface delamination phenomenon was observed through a microscope and measured through scanning acoustic tomograph.

The resin and materials used was as follows.

1. Die Adhesion Epoxy
   a. "ABLEBOND" 84-ILMISR4, a registered mark of Ablestik
   b. Viscosity: 8,000 cps at 25° C.
   c. Electrical conductivity: 13 $\mu$mhos/cm
   d. Thermal conductivity: 2.5 W/m°K.
   e. Glass transition point: 120° C.
   f. Thermal expansion coefficient: $40 \times 10^{-6}$ in/in/°C.
2. Liquid Epoxy Resins: Type 1, 2, 3, 4 and 5 were added with

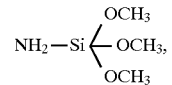

an adhesion promoter, at an amount of 4.0, 3.3, 5.0, 6.2 and 4.5% by weight, respectively, and with ABS resin, an elastomer, at an amount of 1.2% by weight.
   i. Type 1
      a. FP-4450 manufactured by Hysol
      b. Viscosity: 500 ps at 25° C.
      c. Glass transition point: 150° C.
      d. Thermal expansion coefficient: $1.9 \times 10^{-5}$/°C.
      e. Curing condition: 100° C./1 hr+160° C./3 hr
   ii. Type 2
      a. CV5186S manufactured by Matsushita Electric Works, Ltd.
      b. Viscosity: 110 ps at 25° C.
      c. Glass transition point: 150° C.
      d. Thermal expansion coefficient: $3.2 \times 10^{-5}$/°C.
      e. Curing condition: 100° C./1 hr+160° C./3 hr
   iii. Type 3
      a. CV5755A manufactured by Matsushita Electric Works, Ltd.
      b. Viscosity: 760 ps at 25° C.
      c. Glass transition point: 100° C.
      d. Thermal expansion coefficient: $2.3 \times 10^{-5}$/°C.
      e. Curing condition: 130° C./15 min+160° C./3 hr
   iv. Type 4
      a. CV5193A manufactured by Matsushita Electric Works, Ltd.
      b. Viscosity: 950 ps at 25° C.
      c. Glass transition point: 135° C.
      d. Thermal expansion coefficient: $2.3 \times 10^{-5}$/°C.
      e. Curing condition: 100° C./1 hr+160° C./3 hr v. Type 5
  a. CV5183F manufactured by Matsushita Electric Works, Ltd.
  b. Viscosity: 30 ps at 25° C.
  c. Glass transition point: 150° C.
  d. Thermal expansion coefficient: $4.0 \times 10^{-5}/°C$.
  e. Curing condition: 100° C./1 hr+160° C./3 hr
3. Mold Compound
  a. Model KE-1000SR commercially available from Toshiba Chemical Co.
  b. Viscosity: up to 300 ps at 185° C.
  c. Glass transition point: at least 190° C.
  d. Thermal expansion coefficient: $1.7 \times 10^{-5}/°C$.
  e. Curing condition: 100° C./1 hr+160° C./3 hr
  f. Conductivity(extracted water): 13 μS/cm
  g. Molding condition: 185° C./120 sec curing
  h. After molding condition: 175° C./8 hr
4. Lead Frame: PSOP2, 20LD 164×204 W
5. Test Die: 92×101 MIL
6. Observation
  a. an optical microscope with a 50-times magnification.
  b. Scanning Acoustic Tomographer (SAT): manufactured by Sonix.

Test Condition of Semiconductor Packages 1. first condition: stood at 85° C. and at relative humidity of 85% for 168 hrs.
2. second condition: stood at 85° C. and at relative humidity of 60% for 168 hrs.

These test results are given as shown in Table 1 below.

TABLE 1

| Condition | Encap. part coated | Liquid Epoxy | | | | |
|---|---|---|---|---|---|---|
| | | Type1 Thin & Uniform | Type2 1 Point Coating | Type3 2 Point Coating | 1st Type4 2 Point Coating | Type5 Thin & Uniform |
| 1st Cond. | On Chip | 6/6 | 6/6 | 3/6 | 6/6 | 6/6 |
| | Around Chip | 0/6 | 0/6 | 0/6 | 0/6 | 0/6 |
| | Between Epoxy & Heat Sink | *1/6 | 6/6 | **6/6 | 3/6 | **3/6 |
| 2nd Cond. | On Chip | 6/6 | 6/6 | 3/6 | 6/6 | 6/6 |
| | Around Chip | 0/6 | 0/6 | 0/6 | 0/6 | 0/6 |
| | Between Epoxy & Heat Sink | *1/6 | 6/6 | *6/6 | **3/6 | 3/6 |

*one sample very trivial
**two samples very trivial

In Table 1, the numerals before and after "/" represent No. of poor packages/total No. of packages tested. For example, the test of the two-point coated liquid epoxy type 2 under the first severe condition gave "3/6", which represents that three sample packages among six sample packages tested were poor, that is, showed the interface delamination phenomenon.

According to the data of Table 1, most of the samples show the interface delamination at the surface of the chip but this interface delamination can be avoided by coating a polyimide thin film over the surface of the chip 2.

As apparent from Table 1, the semiconductor package 1 with double encapsulating parts according to the present invention did not exhibit the interface delamination at the peripheral part of the semiconductor chip 2 at all. Therefore, the degradation in reliability of a semiconductor package attributable to moisture penetration is almost completely solved. For the delamination at the interface between the epoxy and the heat sink, a significant improvement was brought into Type 1, 3 and 5, especially Type 1. Accordingly, the discharge of the heat generated during circuit operation is not inhibited.

TEST EXAMPLE VI

The heat sink-integrated semiconductor packages 1 and 1a according to the first and second embodiments of the present invention were subjected to a second severe condition set forth as in Test Examples I through V. Observation for the packages was made using a microscope (magnification 50 times).

Figure 4A:
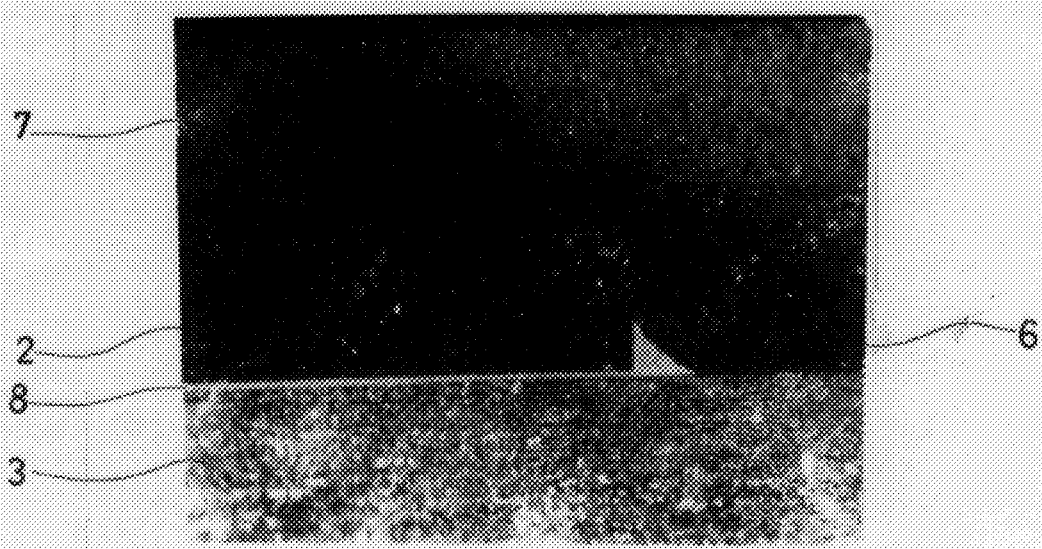
FIGS. 4A and 4B are reproductions of photographs of magnified actual sectional views of the heat sink-integrated semiconductor packages according to the first and the second embodiments, respectively, showing the delamination states after experiencing a severe condition.
Figure 4B:
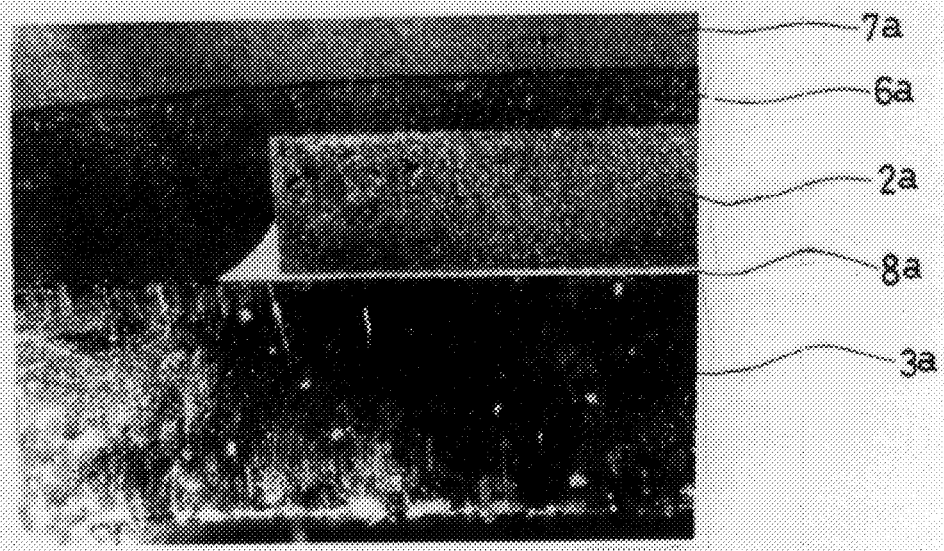

FIGS. 4A and 4B shows the observation results. FIG. 4A and 4B are reproductions of photographs showing the cross sections of the semiconductor packages 1 and 1a, respectively, both using Type 1 as the liquid epoxy resin and being magnified by 50 times.

It is apparent from FIGS. 4A and 4B that the formation of the liquid epoxy encapsulating part, that is, the first encapsulating part 6, 6a, does not permit delamination at the interface between the heat sink 3, 3a and the semiconductor chip 2, 2a and at the lower peripheral part of the semiconductor chip 2, 2a mounted.

COMPARATIVE TEST EXAMPLE I

After being subjected to second severe condition as in Test Example VI, the heat sink-integrated semiconductor package 10 with a single encapsulating part was observed with a microscope to inspect the surface state thereof. The results are shown in FIGS. 7A, 7B and 7C.

Figure 7A:
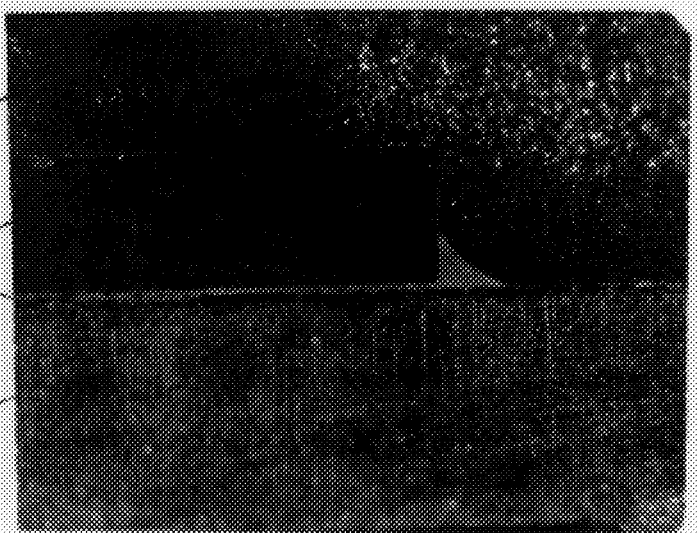
FIGS. 7A to 7C are reproductions of photographs of magnified actual sectional views of the conventional heat sink-integrated semiconductor package with a single encapsulating part, showing the delamination states after experiencing a severe condition.
Figure 7B:
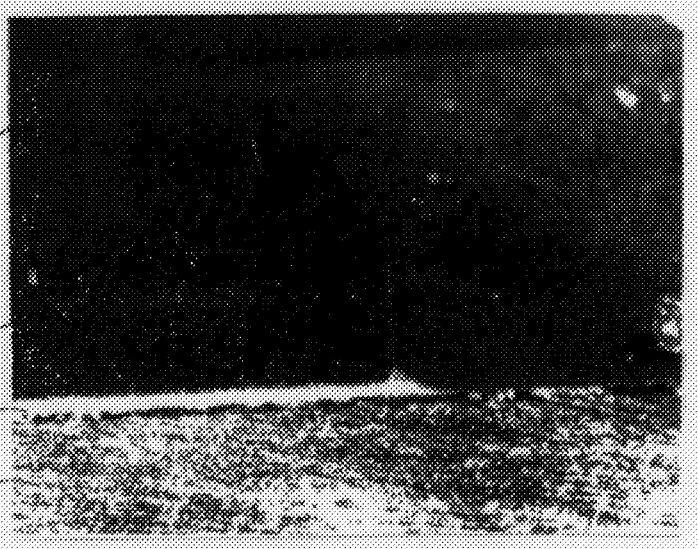
Figure 7C:

As seen in FIGS. 7A to 7C, the conventional package 10 without a liquid epoxy encapsulating part was delaminated at the upper surface of the semiconductor chip 12, the interface between the heat sink 13 and the semiconductor chip 12, and the lower peripheral part of the semiconductor chip 12 mounted.

TEST EXAMPLE VII AND COMPARATIVE TEST EXAMPLE II

The heat sink-integrated semiconductor package 1 with double encapsulating parts according to the first embodiment of the present invention and the conventional heat sink-integrated semiconductor package 10 with a single encapsulating part were subjected to the second severe condition set forth as in Test Examples I through V. For the package 1 of the present invention, Type 1 was employed as the liquid epoxy resin. Thereafter, SAT was used to determine whether the interface delamination occurred. The results are shown in FIG. 5.

FIG. 5 is a scanning acoustic tomograph showing the bottom views of the semiconductor packages 1 and 10. In this drawing, red rectangles represent the heat sink 3 or 13 while circular parts are cylindrical dents which are formed on the bottom of the heat sink 3 or 13 in order for scanning acoustic tomograph. The light gray color within the dent exhibits the delamination at the interface between the heat sink 3 or 13 and the semiconductor chip 2 or 2. Otherwise, no delamination occurs.

In FIG. 5, all compartments located at the upper panel and the left four compartments located at the lower panel are of a scanning acoustic tomograph for the semiconductor package 1 according to the present invention. Of the semiconductor packages 1 according to the present invention, all except the left fourth compartment in the upper panel are cases wherein the liquid epoxy resin is uniformly and thinly coated on all the peripheral parts of the semiconductor chip 2. For the left fourth compartment in the upper panel, only one side of the peripheral parts of the semiconductor chip is coated.

Thus, it is found that, when the uniformly thin coating is carried out on all the peripheral parts, the interface delamination does not occur at all or is almost traceless.

The left fifth and sixth compartments in the lower panel are of a scanning acoustic tomograph for the conventional semiconductor package. In contrast with the package 1 according to the present invention, the conventional one is light gray in color within the dent, which demonstrates a significant delamination state at the interface between the heat sink 13 and the semiconductor chip 12.

COMPARATIVE TEST EXAMPLE III

Different species of the conventional heat sink-integrated semiconductor package 10 with a single encapsulating part were tested in a manner similar to that of Test Example II. The results are shown in FIG. 8.

Figure 8:
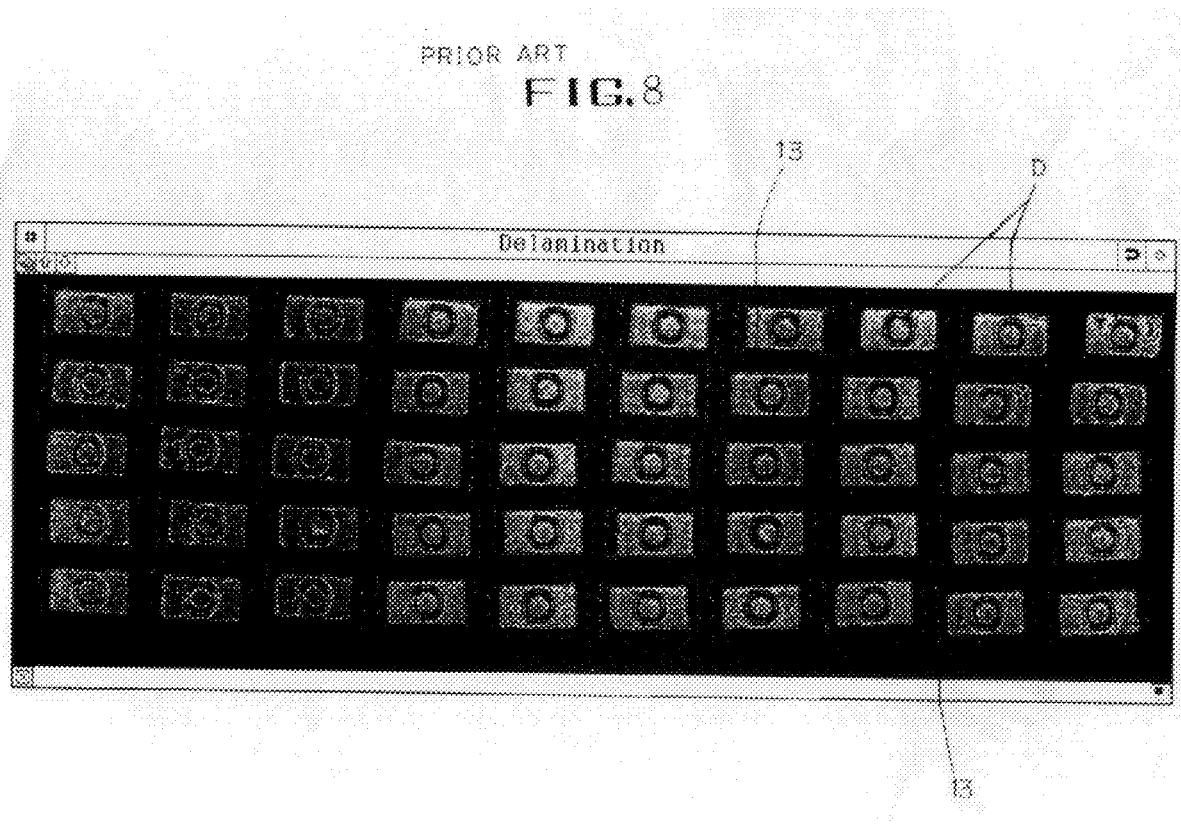
FIG. 8 is a scanning acoustic tomograph of the conventional heat sink-integrated semiconductor package with single encapsulating parts, showing the delamination state after experiencing a severe condition.

As apparent from FIG. 8, the conventional packages 10 all showed significant delamination.

From the above Test Examples and Comparative Test Examples, it is found that the adhesion promoter is preferably added at an amount of 3 to 25% by weight and more preferably 3.5 to 10% by weight. When the adhesion promoter is added at an amount less than 3% by weight, the resulting bonding strength is too low to prevent the interface delamination. On the other hand, if the amount of the adhesion promoter is over 25% by weight, the flow property of the resulting liquid epoxy resin is poor.

It is also found that the elastomer is preferably at an amount of 0.1 to 4% by weight.

As described hereinbefore, since the first encapsulating part made of a liquid epoxy resin added with an adhesion promoter at an amount of 3 to 25% by weight has much higher bonding strength than the second encapsulating part made of ordinary mold compound does, the interface delamination between heat sink and semiconductor chip can efficiently be prevented or relieved, in accordance with the present invention. In addition, the first encapsulating part is formed by dispensing the liquid epoxy resin showing high bonding strength to metal, rather than by molding with a metal mold, according to the present invention. Therefore, although the amount of adhesion promoter increases, such a methodological problem as encountered in the prior art, caused by the sticking to the mold, does not occur.

Consequently, the delamination at the interface generated when a heat sink is attached to a semiconductor chip by an epoxy die adhesive can be prevented or relieved, according to the present invention. By virtue of this advantage, the performance of the semiconductor package, which is usually degraded owing to moisture penetration and heat prevention effect, is constantly maintained. In more detail, when soldering on a mother board, heat is generated, rapidly evaporating the moisture penetrated. However, such evaporation causing volume expansion immediately and leading to cracking in the board can be eliminated or minimized by the present invention.

In addition, the method according to the present invention can be applied not only to lead frames of a quad type but also to heat sink-integrated ball grid array semiconductor packages by slight modification.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A method for fabricating a heat sink-integrated semiconductor package, comprising the steps of:

providing a heat sink;

attaching a plurality of leads to a first surface of the heat sink along peripheral parts of the heat sink by an adhesive tape, with a regular distance therebetween, said heat sink having a second surface opposite the first surface;

mounting a semiconductor chip on a central part of the first surface of the heat sink bounded by said leads;

electrically connecting said leads to chip pads on said semiconductor chip by wires;

dispensing a liquid epoxy resin over a bare surface of only said heat sink first surface between said mounted semiconductor chip and said tape, said tape laterally confining the liquid epoxy resin;

curing said dispensed liquid epoxy resin to form a first encapsulating part so as to prevent delamination at the interface between said heat sink and said semiconductor chip; and molding a mold compound to form a second encapsulating part to protect said leads, said semiconductor chip and said wires from the external environment and to leave said heat sink second surface exposed to the external environment.

2. A method in accordance with claim 1, wherein said liquid epoxy resin is dispensed over a region defined by inner edges of said leads attached on said adhesive tape, to encapsulate the entire surface of said semiconductor chip and said bare surface of said heat sink.

3. A method in accordance with claim 1, further comprising the step of forming a dam shaped in a rectangular ring on said inner edges of said leads attached on peripheral parts of said heat sink by use of an adhesive, wherein said first encapsulating part is dispensed within the region defined by said dam, to cover the entire surface of said semiconductor chip, the bare surface of said heat sink and said connecting wires and wherein the molding compound surrounds an exterior periphery of said dam.

4. A method in accordance with claim 3, wherein said dam is made of one selected from the group consisting of Cu, Al, Ni or the alloy thereof.

5. A method in accordance with claim 3, wherein said dam is formed by dispensing a liquid epoxy resin and curing it, without using adhesive.

6. A method in accordance with claim 1, wherein said liquid epoxy resin includes an adhesion promoter comprising a compound represented by the following structural formula I:

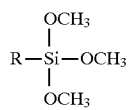

wherein R is selected from the group consisting of ethylene oxide, an amino group, an imino-mediated amino group, a thiol group, and an ionomer.

7. A method in accordance with claim 6, wherein said adhesion promoter is added at an amount of 3 to 25% by weight, based on the weight of the liquid epoxy resin.

8. A method in accordance with claim 1 or 7, wherein said liquid epoxy resin comprises at least one elastomer selected from the group consisting of an acrylonitrile-butadiene-styrene resin, a nitrile resin, a silicon resin and a polyurethane resin, at an amount of 0.1 to 4% by weight.

9. A method in accordance with claim 1, further comprising the step of coating a polyimide thin layer on the surface of said semiconductor chip prior to the dispensing step.

* * * * *